United States Patent
Hierlemann et al.

(10) Patent No.: US 7,449,374 B2
(45) Date of Patent: Nov. 11, 2008

(54) METHODS OF MANUFACTURING SEMICONDUCTOR DEVICES WITH ROTATED SUBSTRATES

(75) Inventors: Matthias Hierlemann, Fishkill, NY (US); Chun-Yung Sung, Poughkeepsie, NY (US); Brian J. Greene, Yorktown Heights, NY (US); Manfred Eller, Wappingers Falls, NY (US)

(73) Assignees: Infineon Technologies AG, Munich (DE); Internatioanl Business Machines Corporation, Armonk, NY (US)

( * ) Notice: Subject to any disclaimer, the term of this patent is extended or adjusted under 35 U.S.C. 154(b) by 0 days.

(21) Appl. No.: 11/710,382

(22) Filed: Feb. 23, 2007

(65) Prior Publication Data

US 2007/0173003 A1 Jul. 26, 2007

Related U.S. Application Data

(62) Division of application No. 11/076,080, filed on Mar. 9, 2005, now Pat. No. 7,205,639.

(51) Int. Cl.
*H01L 21/84* (2006.01)
(52) U.S. Cl. ............... 438/150; 438/198; 438/199; 438/166; 438/178; 257/E29.004
(58) Field of Classification Search ........... 438/199, 438/150, 166, 178, 198, 973, 982; 257/E29.004
See application file for complete search history.

(56) References Cited

U.S. PATENT DOCUMENTS

| | | | |
|---|---|---|---|
| 5,729,045 A | | 3/1998 | Buynoski |
| 6,794,718 B2 * | | 9/2004 | Nowak et al. ............... 257/347 |
| 2004/0217448 A1 | | 11/2004 | Kumagai et al. |
| 2006/0160314 A1 * | | 7/2006 | Arghavani .................. 438/285 |

OTHER PUBLICATIONS

Kanda, Y., "A Graphical Representation of the Piezoresistance Coefficients in Silicon," IEEE Transactions on Electron Devices, Jan. 1982, pp. 64-70, vol. ED-29, No. 1.
Komoda, T., et al., "Mobility Improvement for 45nm Node by Combination of Optimized Stress Control and Channel Orientation Design," IEDM Technical Digest, 2004, pp. 217-220.
Sayama, H., et al., "Effect of <100> Channel Direction for High Performance SCE Immune pMOSFET with Less Than 0.15 μm Gate Length," IEDM Technical Digest, Mar. 1999, pp. 657-660.

* cited by examiner

*Primary Examiner*—Long K Tran
(74) *Attorney, Agent, or Firm*—Slater & Matsil, L.L.P.

(57) ABSTRACT

Integrated circuits are oriented on a substrate at an angle that is rotated between 5 to 40 degrees from a direction parallel or perpendicular to a preferred crystalline plane direction, such as the cleavage plane, of the substrate. Parameters such as stress and mobility of transistors may be optimized by adjusting the angle of rotation of the substrate. For a rotated substrate CMOS device design, other stress control measures may be used, such as a stress control or tensile liner, over an NMOS transistor, PMOS transistor, or both, to further adjust the stress and improve performance.

24 Claims, 4 Drawing Sheets

METHODS OF MANUFACTURING SEMICONDUCTOR DEVICES WITH ROTATED SUBSTRATES

This application is a divisional of patent application Ser. No. 11/076,080, entitled "Semiconductor Devices with Rotated Substrates and Methods of Manufacture Thereof," filed on Mar. 9, 2005, now U.S. Pat. No. 7,205,639 which application is incorporated herein by reference.

TECHNICAL FIELD

The present invention relates generally to the design and manufacture of semiconductor devices, and more particularly to methods of manufacturing transistors with rotated substrates and structures thereof.

BACKGROUND

Generally, semiconductor devices are electrical devices that utilize a semiconductor as a material component. Semiconductor devices are used in a variety of electronic applications, such as computers, cellular phones, personal computing devices, and many other applications. Home, industrial, and automotive devices that in the past comprised only mechanical components now have electronic parts that require semiconductor devices, for example.

Semiconductor devices are manufactured by depositing many different types of material layers over a semiconductor workpiece or wafer, and patterning the various material layers using lithography. The material layers typically comprise thin films of conductive, semiconductive, and insulating materials that are patterned and etched to form integrated circuits (IC's). There may be a plurality of transistors, memory devices, switches, conductive lines, diodes, capacitors, logic circuits, and other electronic components formed on a single die or chip.

One type of transistor device is a complimentary metal oxide semiconductor (CMOS) device, in which a p-channel metal oxide semiconductor (PMOS) transistor and an n-channel metal oxide semiconductor (NMOS) transistor are used in complimentary configurations.

In semiconductor devices, electron mobility changes when silicon crystals are strained. As CMOS devices are scaled down in size, stress engineering is becoming more important, in particular due to the fact that electron and hole mobility change when silicon crystals are strained. In transistor designs, the effects of stress are actively used, such as the effects of tensile and compressive stress, to raise mobility and increase speed of transistors.

Stress is introduced by applying tensile liners and by forming germanium-containing materials in the source, drain, and channel regions, for example. However, PMOS transistors respond differently to stress than NMOS transistors, and thus, it can be challenging to manufacture CMOS devices with optimized stress.

Thus, what are needed in the art are improved methods of creating and utilizing stress to optimize the performance of semiconductor devices.

SUMMARY OF THE INVENTION

These and other problems are generally solved or circumvented, and technical advantages are generally achieved, by preferred embodiments of the present invention, which provide novel methods of fabricating semiconductors and structures thereof, wherein devices are oriented on a substrate at an angle of between 0 and 45 degrees relative to a preferred crystalline plane direction of a given substrate, e.g., relative to a cleavage plane of a workpiece. The cleavage plane may comprise the <110> direction on a <100> substrate, for example. The amount of stress for an NMOS device, a PMOS device, or both, may be optimized, in accordance with embodiments of the present invention.

In accordance with a preferred embodiment of the present invention, a semiconductor device includes a portion of a semiconductor wafer, the portion of the semiconductor wafer having a preferred crystalline plane direction, and a plurality of devices formed over the portion of the semiconductor wafer. A portion of the plurality of devices is formed within the workpiece. The plurality of devices are oriented at an angle of between 5 and 40 degrees with respect to a direction parallel or perpendicular to the preferred crystalline plane direction of the portion of the semiconductor wafer.

In accordance with another preferred embodiment of the present invention, a method of fabricating a semiconductor device includes providing a semiconductor wafer, the semiconductor wafer having a preferred crystalline plane direction, and forming a plurality of devices over the semiconductor wafer. A portion of the plurality of devices is formed within the workpiece. Forming the plurality of devices includes orienting the devices at an angle of between 5 and 40 degrees with respect to a direction parallel or perpendicular to the preferred crystalline plane direction of the semiconductor wafer.

In accordance with yet another preferred embodiment of the present invention, a method of manufacturing a semiconductor device includes providing a semiconductor wafer, the semiconductor wafer comprising a semiconductive material having a preferred crystalline plane direction. A mask set for a plurality of semiconductor devices is provided, and the semiconductor wafer is positioned in a lithography tool such that the preferred crystalline plane direction is rotated at an angle of between 5 and 40 degrees from a direction parallel or perpendicular to the preferred crystalline plane direction. At least one material layer is disposed over the semiconductor wafer. The semiconductor wafer and the at least one material layer are processed and patterned using the mask set.

Advantages of embodiments of the present invention include decoupling the effects of mechanical stress on PMOS and NMOS devices by changing sensitivity to individual stress components by rotating the wafer between 0 and 45 degrees with respect to a cleavage plane of the workpiece, while at the same time optimizing mobility. A wider process window and reduction in complexity of stress reduction measures can be achieved.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

Figure 1:
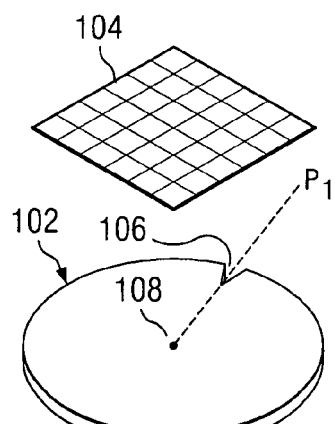
FIG. 1 is a diagram showing a semiconductor wafer oriented parallel or perpendicular to a preferred crystalline axis, such as a cleavage plane of the wafer, to a lithography mask.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely for use in CMOS devices. Embodiments of the invention may also be applied, however, to other semiconductor devices, for example.

Mobility and speed of PMOS and NMOS transistors of CMOS devices may be improved by the use of a stress control film disposed over the transistors, as described in U.S. Patent Application Publication No. US 2004/0217448 A1 by Kumagai et al., published on Nov. 4, 2004. The stress control film outlined by Kumagai et al. is applied over and applies stress to the channels of both the PMOS and NMOS transistors. Other means of improving mobility include epitaxial SiGe source/drain constructions, introducing germanium into the channel region of transistors, and forming STI liners, as examples.

Embodiments of the present invention achieve technical advantages by rotating substrates relative to a cleavage plane of a substrate before forming devices thereon, either in combination with, or without the use of, other methods of stress engineering.

CMOS devices are typically oriented on a substrate parallel or perpendicular to the preferred crystalline plane of the substrate. Transistors are typically aligned with respect to a substrate such that the drain current of the transistors flows either parallel to a <110> crystal axis or to a direction equivalent to the <110> crystal axis on a <100> substrate.

There are several reasons why semiconductor devices are oriented either parallel or perpendicular to the preferred crystalline plane of a substrate. First, the natural cleave direction of a substrate is along the preferred crystalline plane; thus, it is easier to analyze devices for failures and other processing analysis because the devices are easier to cross-section. Another reason is that for many years, it has been customary to orient semiconductor devices in a parallel or perpendicular direction to the preferred crystalline plane of a substrate. The manufacturing process of semiconductor devices is quite complex and the industry cannot introduce new processing changes without introducing the necessary steps to assess and reduce the risk in all aspects in order to analyze the effects of a particular change.

In papers entitled, "Effect of <100> Channel Direction for High Performance SCE Immune pMOSFET with Less Than 0.15 µm Gate Length" by H. Sayama et al., in IEDM 1999, pp. 657 to 660, and "Mobility Improvement for 45 nm Node by Combination of Optimized Stress Control and Channel Orientation Design" by T. Komoda et al., in IEDM 2004, pp. 217 to 220, orienting wafers at a 45 degree angle with respect to the crystal plane orientation is disclosed, resulting in increased mobility.

Embodiments of the present invention achieve technical advantages by intentionally rotating a substrate by between an angle of 0 and 45 degrees from a preferred crystalline plane orientation, but not exactly at 0 or 45 degrees, and fabricating semiconductor devices such that they are oriented between 0 and 45 degrees from a direction parallel or perpendicular to the preferred crystalline plane of the substrate. Advantageously, rotating the substrate changes the hole mobility and influence of stress of the devices formed in the substrate, by affecting the mobility in the channel region of the PMOS and NMOS device. The angle of rotation may be tuned and optimized between the angles of 0 and 45 degrees for a particular application, for example. In one embodiment, the angle of rotation is preferably about 5 to 40 degrees with respect to a direction parallel or perpendicular to the cleavage plane of a semiconductor wafer, for example.

The term "preferred crystalline plane" used herein refers to a previously preferred crystalline plane orientation typically used in the prior art, such as the cleavage plane of a semiconductor wafer or workpiece. For example, a <100> substrate, due to the crystalline structure of silicon, has natural cleavage planes at 90 degrees, as a function of the Si crystal structure. The wafer has a tendency to naturally cleave along the <110> cleavage plane, e.g., into four quarter portions. For example, the preferred crystalline planes described herein may comprise planes having a <100> crystal axis or a direction equivalent to a <100> axis, in some embodiments, such as <010>, <001>, <-100>, <0-10>, <00-1>, as examples. Alternatively, the crystalline planes may comprise planes having a <110> crystal axis or a direction equivalent to a <110> axis, such as <110>, <011>, <101>, <-110>, <0-11>, <10-1>, as examples.

FIG. 1 is a diagram showing a semiconductor wafer 102 oriented parallel or perpendicular to a preferred crystalline axis or crystalline plane direction $P_1$ to a lithography mask 104. The notch 106 is a marker on the semiconductor wafer 102 that indicates the direction $P_1$ of the preferred crystalline plane. Semiconductor wafers 102 typically are manufactured with some type of marker such as notch 106 so that operators of the lithography equipment can align the semiconductor wafers 102 either parallel or perpendicular to the cleavage plane or crystalline plane direction $P_1$, for example. Some wafers 102 may have one flattened edge (not shown) that may also be used as a marker of the crystalline plane direction $P_1$, for example.

Figure 2:
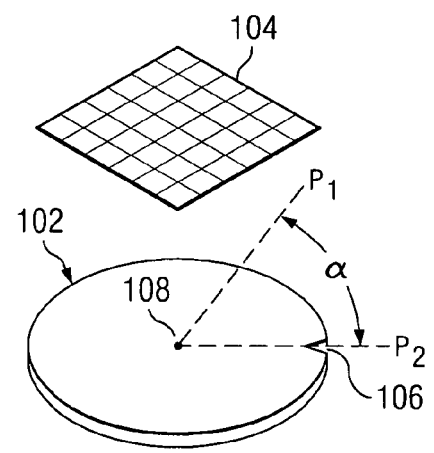
FIG. 2 is a diagram showing a semiconductor wafer oriented at an angle of between 0 and 45 degrees to a direction parallel or perpendicular to a preferred crystalline axis to a lithography mask in accordance with an embodiment of the present invention.

In accordance with preferred embodiments of the present invention, the wafer 102 is rotated about a central point 108 by an angle $\alpha$ to a position $P_2$ relative to the mask 104, as shown in FIG. 2. The angle $\alpha$ between $P_2$ and $P_1$ preferably is between 0 and 45 degrees, and more preferably comprises about 5 to 40 degrees with respect to the direction $P_1$ parallel or perpendicular to the preferred crystalline plane direction $P_1$ of the semiconductor wafer 102. The in-between 0 and 45 deg rotated direction can be marked by a notch (or a flat) for ease of manufacturing, in accordance with a preferred embodiment of the present invention, for example.

One or more lithography masks may be used to process or pattern the semiconductor wafer 102 and material layers disposed on the wafer 102, in accordance with embodiments of the present invention. In one embodiment, a method of manufacturing a semiconductor device includes providing a semiconductor wafer 102, the semiconductor wafer 102 comprising a semiconductive material comprising a preferred crystalline plane direction $P_1$, providing a mask set (e.g., represented by the single lithography mask 104 in FIGS. 1 and 2) for a plurality of semiconductor devices to be formed on the semiconductor wafer 102, and positioning the semiconductor wafer 102 in a lithography tool (not shown) such that the preferred crystalline plane direction $P_1$ is rotated at an angle $\alpha$ of between 0 and 45 degrees from a direction parallel or perpendicular to the preferred crystalline plane direction $P_1$, for example. At least one material layer (not shown) is disposed over the semiconductor wafer 102, and the semiconductor wafer 102 is processed and patterned, e.g., including doping, depositing layers of photoresist and hard masks and using the mask set to transfer patterns to the photoresist, hard masks or to mask portions of the semiconductor wafer while other portions are doped, for example.

Rotating the substrate or semiconductor wafer 102 changes stress sensitivity in the substrate or top surface of the semiconductor wafer 102 for devices that are formed within and over the semiconductor wafer 102, and changes hole mobility. In particular, rotating the substrate 102 alters the way in which a device formed within the substrate 102 responds to stress. For example, if transistors are formed in the semiconductor wafer 102, the channels of the transistors have modified stress, which improves the performance of a final product, application, or device. The stress, and thus, the performance of devices are tuned by adjusting the angle $\alpha$ of rotation of the substrate 102, in accordance with embodiments of the present invention.

Figure 3A:
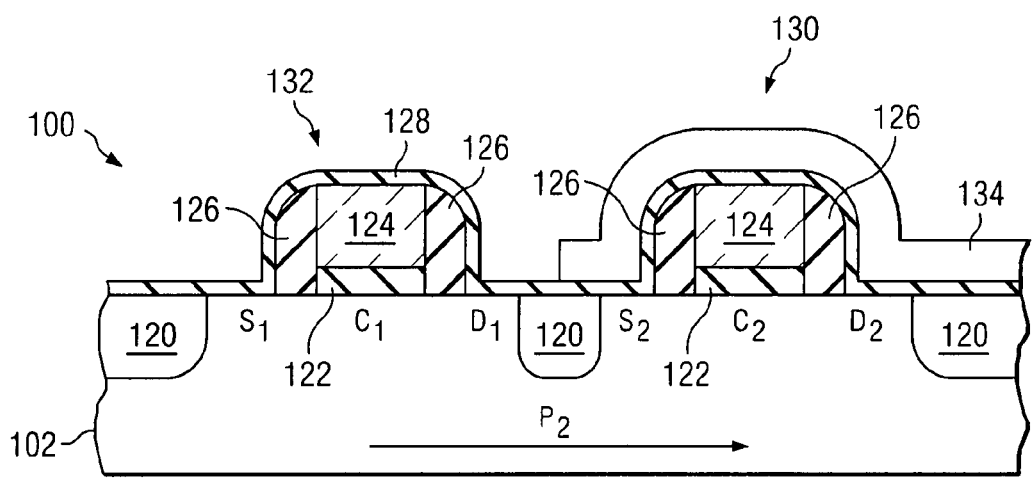
FIGS. 3a and 3b show cross-sectional views of a semiconductor device at various stages of manufacturing in accordance with preferred embodiments of the present invention.
Figure 3B:
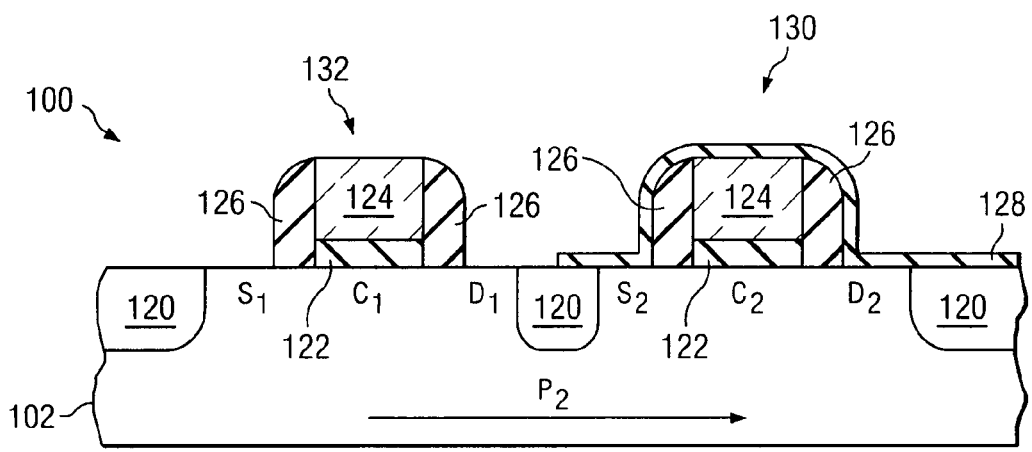

FIGS. 3a and 3b show cross-sectional views of a semiconductor device 100 at various stages of manufacturing in accordance with an embodiment of the present invention. In this embodiment, the semiconductor devices 100 formed within and over the semiconductor wafer 102 comprise a CMOS device 100, comprising an NMOS transistor 130 and a PMOS transistor 132. The NMOS transistor 130 comprises a source $S_2$ and drain $D_2$ separated by a channel $C_2$. A gate oxide 122 and gate 124 are disposed over the channel region $C_2$, as shown. Likewise, the PMOS transistor 132 comprises a source $S_1$ and drain $D_1$ separated by a channel $C_1$, and a gate oxide 122 and gate 124 are disposed over the channel region $C_1$, as shown. Shallow trench isolation (STI) regions 120 may separate devices 100 from one another, including the NMOS 130 and PMOS 132 devices. Only one CMOS device 100 is shown; however, there may be several hundred or thousands of CMOS devices 100 formed on a single semiconductor wafer 102, for example.

In accordance with a preferred embodiment of the present invention, the channels $C_2$ and $C_1$ of the NMOS device 130 and the PMOS device 132 are positioned in a direction $P_2$ that is rotated from a cleavage direction of the semiconductor wafer 102 by between 0 and 45 degrees, and more preferably by about 5 to 40 degrees, in one embodiment. The semiconductor wafer 102 is doped p type for the NMOS transistor 130 and is doped n type for the PMOS transistor 132. The crystalline orientation of the wafer 102 affects n type silicon and p type silicon differently, to be discussed further herein; therefore, rotating the substrate or wafer 102 changes the sensitivity of the transistors 130 and 132 differently. Thus, the angle $\alpha$ (not shown in FIGS. 3a and 3b; see FIG. 2) may be tuned to optimize the performance of the CMOS device 100 in accordance with a preferred embodiment of the present invention.

In one embodiment of the present invention, no additional stress control or engineering is required, because the angle of rotation of the substrate is optimized for both the NMOS 130 and the PMOS 132 transistors. However, in another embodiment, one transistor 130 or 132 may be optimized using stress control or stress inducing measures, whereas the other transistor 132 or 130 may be optimized with respect to the first transistor 130 or 132 by rotating the substrate 102 at an angle of 0 to 45 degrees with respect to the preferred plane direction, e.g., direction $P_1$ shown in FIG. 1, for example.

For example, the angle of rotation may be optimized for the performance of the PMOS transistor 132, as shown in FIG. 3a. A stress-inducing material layer 128 may be disposed over the NMOS transistor 130 but not the PMOS transistor 132. The stress measures may be adjusted to provide all of the stress that the NMOS transistor 130 channel $C_2$ requires, for example. The rotation angle of the substrate 102 may be adjusted to optimize the mobility for the PMOS transistor 132. Thus, a stress-inducing material layer 128 may not be required over the PMOS transistor 132, in accordance with an embodiment of the present invention.

In this embodiment, the stress-inducing material layer 128 may be deposited over both the NMOS transistor 130 and the PMOS transistor 132. The stress-inducing material layer 128 may be deposited over the gates 124 and sidewall spacers 126 of the transistors 130 and 132, and over exposed portions of the substrate 102, for example, as shown in FIG. 3a. A photoresist 134 or other masking material such as a hard mask may be deposited over the stress-inducing material layer 128. The photoresist 134 is patterned to expose the PMOS transistor 132, as shown.

The photoresist 134 is then used as a mask while exposed portions of the stress-inducing material layer 128 are removed from over the PMOS transistor 132, as shown in FIG. 3b. The photoresist 134 is then removed, and the processing for the CMOS device 100 is then continued, such as depositing an insulating layer, and forming contacts to make electrical contact to the sources, drains, and gates of the transistors 130 and 132, as examples (not shown). Other stress-control methods may be used to further optimize the performance of the PMOS transistor 132 (not shown), such as by epitaxially growing SiGe over the source $S_2$ and drain $D_2$, forming Ge in the channel region $C_2$, or forming a liner over the STI regions 120, as examples, although other stress-control methods and/or stress-inducing methods may also be used. For example, an epitaxially-formed lattice strained material, such as germanium or carbon-containing silicon alloys, may be formed over the source $S_2$ and drain $D_2$.

Likewise, in another embodiment, the rotation angle with respect to the cleavage plane or preferred crystalline plane may be optimized for the performance of the NMOS device 130, for example, not shown. In this embodiment, other stress-control and/or stress-inducing measures may be used to optimize the performance of the PMOS device 132.

In yet another embodiment, the rotation of the substrate 102 is used in combination with stress-control and stress-inducing methods for both the NMOS device 130 and the PMOS device 132. The same stress-control and/or stress-inducing method may be used for the NMOS device 130 and the PMOS device 132 in this embodiment, for example. As an example, a single stress-inducing liner 128 may be formed over the NMOS device 130 and the PMOS device 132, as shown in FIG. 3a, and the liner 128 may be left remaining over both the NMOS device 130 and the PMOS device 132.

Figure 4:
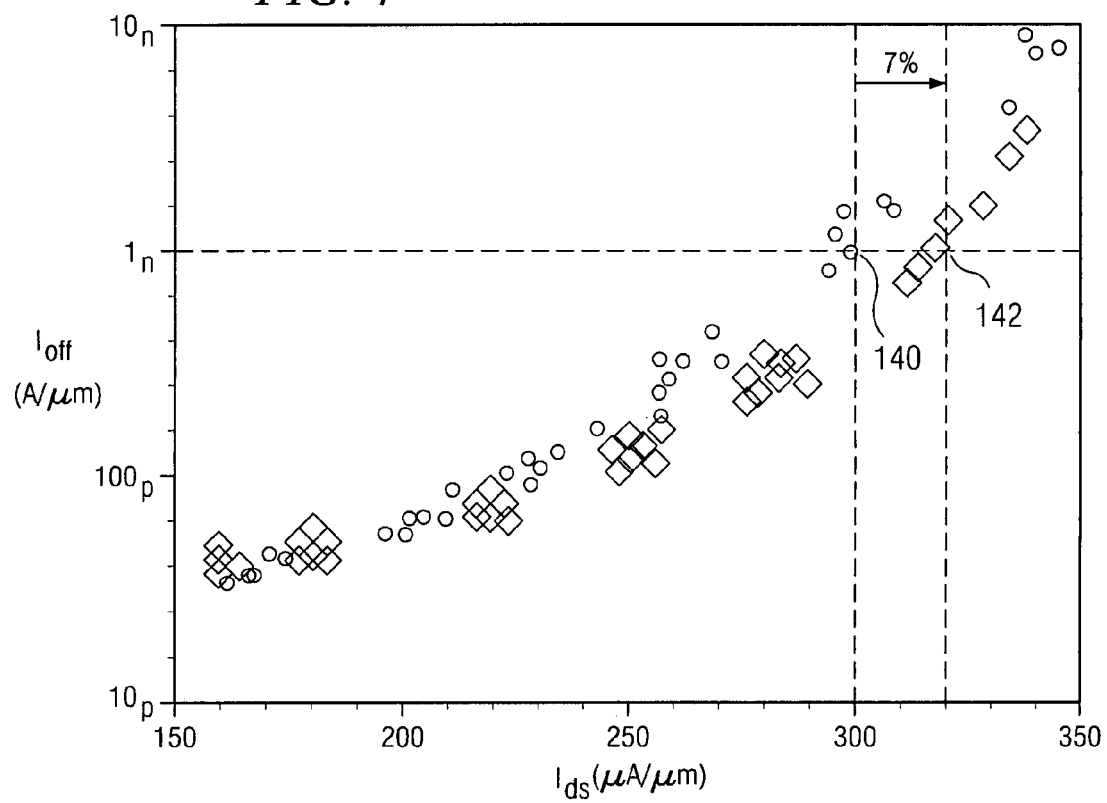
FIG. 4 is a graph comparing the source-drain current for PMOS devices having a channel oriented parallel to the preferred crystalline plane direction and at 45 degrees to the preferred crystalline plane direction.

FIG. 4 is a graph showing characteristics and experimental results of substrates 102 oriented at exactly 45 degrees. Embodiments of the present invention comprise rotating substrates 102 at angles less than 45 degrees; however, the graphs show the impact of rotation of the substrate 102 on various transistor parameters. FIG. 4 was obtained from the paper entitled, "Effect of <100> Channel Direction for High Performance SCE Immune pMOSFET with Less Than 0.15 µm Gate Length" by H. Sayama et al., in IEDM 1999, pp. 657 to 660 mentioned previously herein. The graph in FIG. 4 compares the source-drain current for PMOS devices having a channel oriented parallel to the preferred crystalline plane direction and at 45 degrees to the preferred crystalline plane direction. The $I_{ds}$-$I_{off}$ characteristic of a <100> channel field effect transistor (FET) (which is rotated 45 degrees to the <110> crystalline plane direction and is shown at 142) was found to be about 7% larger than that of a <110> PMOS device (shown at 140) under the same $I_{off}$ conditions of 1 nA/µum.

Figure 5:
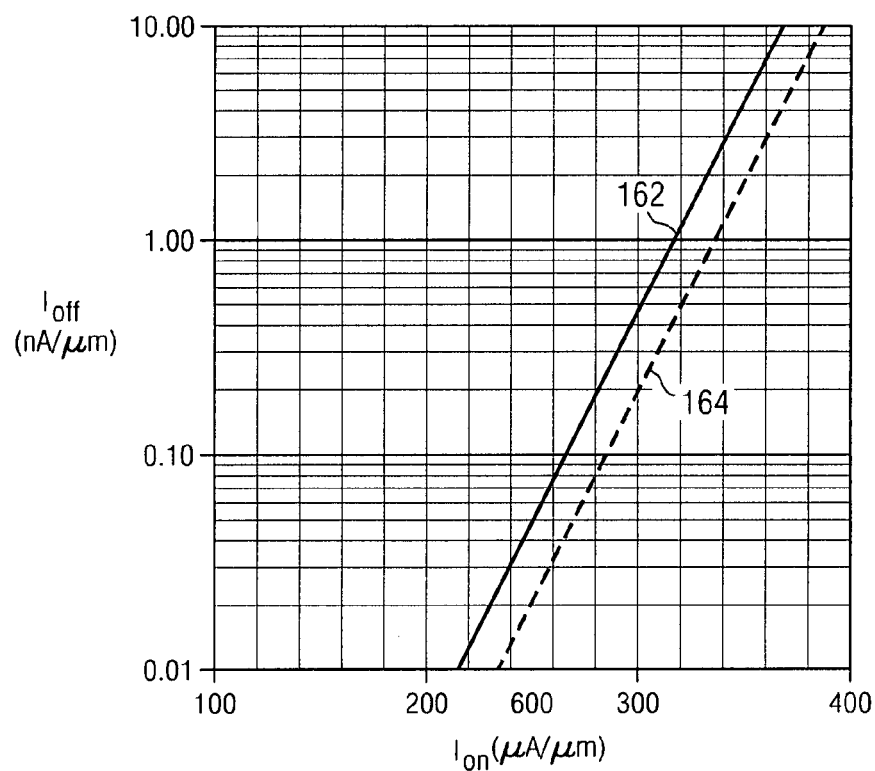
FIG. 5 is a graph showing the effect on $I_{off}$ vs. $I_{on}$ for PMOS devices having channels oriented parallel to the preferred crystalline plane direction and at 45 degrees to the preferred crystalline plane direction.

FIG. 5 shows a graph showing $I_{off}$ vs. $I_{on}$ for a PMOS device, which is sensitive to wafer or substrate rotation. Results for a non-rotated wafer are shown at 162, and results for a wafer rotated at exactly 45 degrees are shown at 164. The performance of the PMOS device was increased by the rotation of the wafer, which enhanced mobility in the channel of the PMOS device, improving $I_{on}/I_{off}$ performance.

Figure 6A:
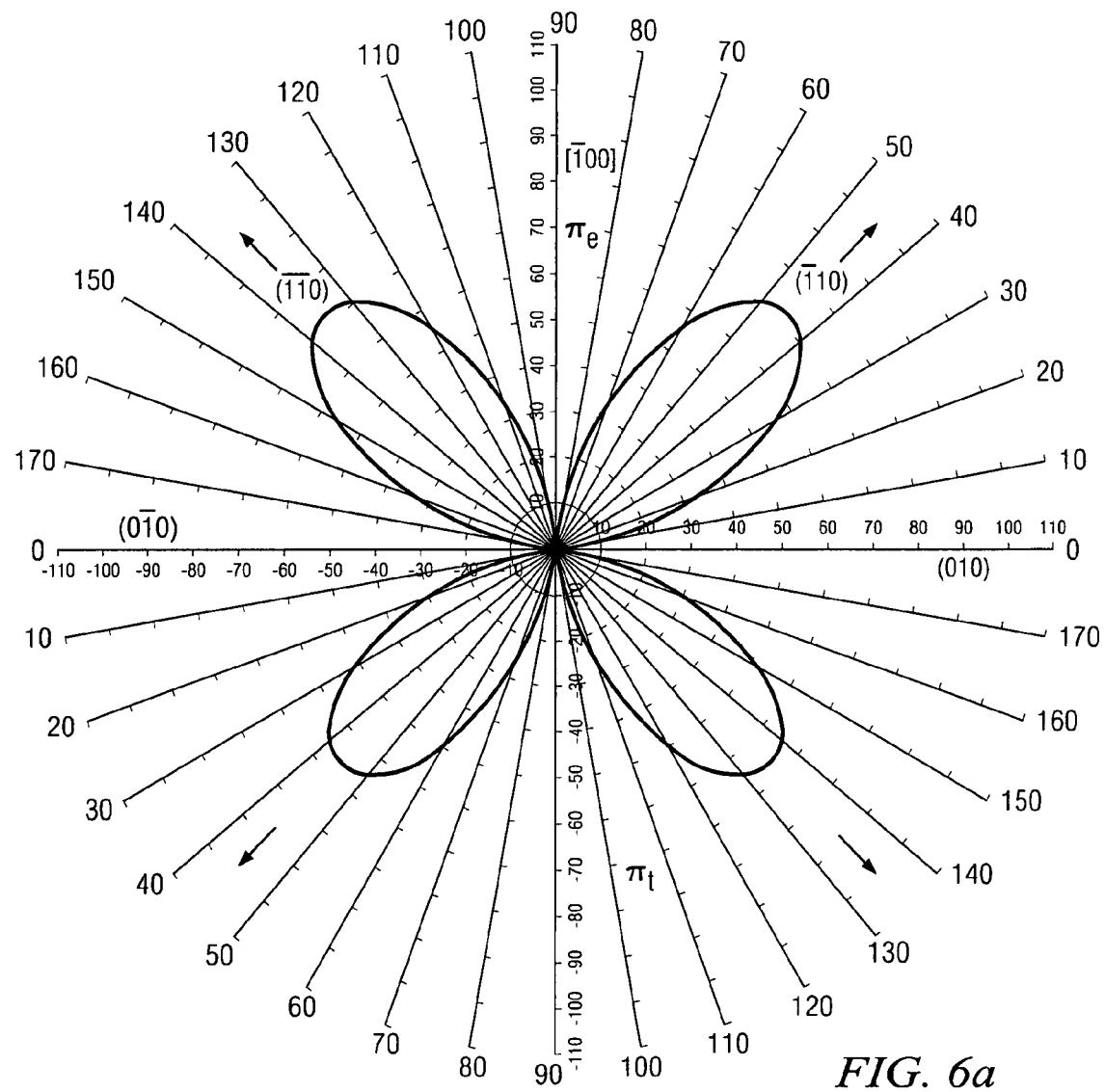
FIGS. 6a and 6b are graphs showing the piezoelectric coefficients of P doped silicon and N doped silicon, respectively, which are a measure for the sensitivity of the NMOS and PMOS devices with respect to implemented stress.
Figure 6B:
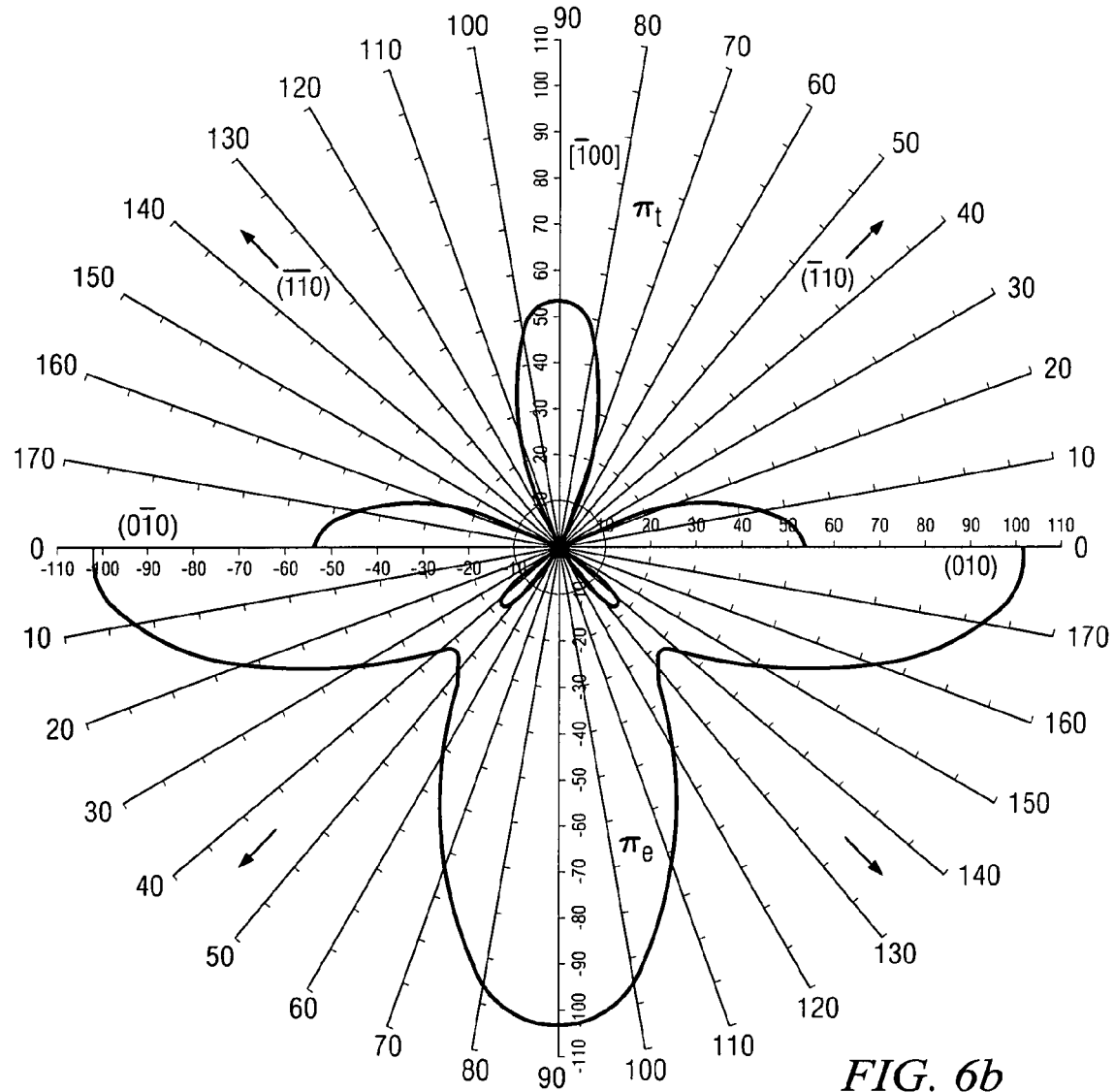

FIGS. 6a and 6b are graphs showing the piezoelectric coefficients of P doped silicon (p-Si) and N doped silicon (n-Si), respectively, which are a measure for the sensitivity of the NMOS and PMOS devices, respectively, with respect to implemented stress. The graphs shown in FIGS. 6a and 6b were obtained from an article by Y. Kanda entitled "A Graphical Representation of the Piezoresistance Coefficients in Silicon," IEEE Transactions on Electron Devices, Vol. ED-29, No. 1, January 1982, pp. 64-70, at p. 65, which article is incorporated herein by reference. The upper half circle of the graphs shows transversal stress response to orientation on a <100> surface and the lower half circle shows longitudinal stress response to orientation on a <100> surface.

In FIGS. 6a and 6b, the 180 degree half circle and some major directions are defined by the crystal plane. Crystalline silicon has a limited number of defined locations or places on the graph, for example. As a wafer is rotated, the sensitivity value on the curve is changed. The curve for p doped silicon is different from the curve for n doped silicon, reflecting the difference in stress sensitivity. Thus, a wafer may be rotated to modulate or improve the sensitivity.

The use of variable rotated substrates 102 between the angle of 0 and 45 degrees with respect to the preferred crystalline plane direction improves mobility. Furthermore, in combination with other stress enhancement measures, rotated substrates at least partially decouple the effects of mechanical stress on PMOS and NMOS devices by changing sensitivity to individual stress components. Empirically, the piezoresistance coefficients for silicon accurately predict the device performance enhancement, due to applied stress in modern transistors. By evaluating the wafer orientation dependence of these piezoresistance coefficients, for e.g., (100) surface wafers with a rotation angle of 0 to 45 degrees, the PFET can be tuned to be insensitive to applied stress, while the NFET stress sensitivity will be increased. This occurs because the PFET piezoresistance coefficients are reduced up to an order of magnitude in the rotated wafer, and the impact of the rotated wafer on the NFET piezoresistance coefficients, while favorable, are more subtle.

In the case of an NFET, the longitudinal piezoresistance coefficient is enhanced by up to a factor of about 3 by rotating the substrate, the transverse piezoresistance coefficient can change sign, and its magnitude is also increased up to a factor of about 3, and the vertical piezoresistive coefficient is unchanged. The resulting NFET response to stress is expected therefore to be improved relative to prior art substrates that are aligned along a cleavage plane for these reasons. For example, for a given stress liner 128 as shown in FIGS. 3a and 3b, which exhibits primarily longitudinal and vertical stress, rotating a wafer 102 would result in an improvement of about two times the ion improvement in a rotated wafer compared a non-rotated wafer. Furthermore, the change in sign in the NFET transverse piezoresistance coefficient on the rotated wafer indicates that the influence of the STI stress will be increased in the transverse direction, which will result in higher current drive as device width is reduced. This is because STI stress is usually compressive, which is beneficial for an NFET device formed on a rotated substrate, for example.

Thus, embodiments of the present invention allow a semiconductor design engineer to optimize 'natural' mobility and stress enhanced mobility. The stress of NFETs and PFETs may be coupled or de-coupled, depending on the design parameters, by selecting and optimizing the rotation angle, and also by the use of other stress-inducing means. Due to decoupling the sensitivity of device mobility to stress, a significant savings in fabrication cost may be achieved. For example, when compared to a neutral liner on a rotated wafer, a single deposited tensile nitride liner is calculated to improve NFET ion mobility by up to about 20%, while the effect on PFET performance can be negligible. Thus, advantageously, implant relaxation of the tensile nitride over the PFET can become unnecessary in a rotated wafer system. A substrate may be positioned such that the angle of rotation achieves a predetermined mechanical stress sensitivity of semiconductor devices formed on the substrate.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of fabricating a semiconductor device, the method comprising:
forming a plurality of devices on a surface of a semiconductor wafer, wherein forming the plurality of devices comprises orienting the devices at a first angle to the <110> or <100> crystalline plane direction of the semiconductor wafer, wherein all the devices on the wafer are aligned at the first angle or a second angle, wherein the first angle is about 5 degrees to about 40 degrees, and the second angle is perpendicular to the first angle.

2. The method according to claim 1, wherein forming the plurality of devices comprises forming complimentary metal oxide semiconductor (CMOS) devices, wherein forming each CMOS device comprises forming a p-channel metal oxide semiconductor (PMOS) transistor and forming an n-channel metal oxide semiconductor (NMOS) transistor.

3. The method according to claim 2, wherein forming the plurality of devices comprises forming a stress-inducing means in the PMOS transistor, in the NMOS transistor, or in both.

4. The method according to claim 2, wherein forming the plurality of devices comprises forming a stress-inducing material layer over the PMOS transistor and/or the NMOS transistor.

5. The method according to claim 2, wherein forming the plurality of devices comprises forming a stress-inducing material layer in a shallow trench isolation region proximate the PMOS transistor and/or the NMOS transistor.

6. The method according to claim 2, wherein forming the plurality of devices comprises forming a germanium-containing material in source/drain regions of the PMOS transistor and/or the NMOS transistor.

7. The method according to claim 2, wherein forming the plurality of devices comprises forming a germanium-containing material in a channel of the PMOS transistor and/or the NMOS transistor.

8. The method according to claim 1, wherein forming the plurality of devices comprises forming an n-channel transistor and a p-channel transistor, each transistor comprising a source and a drain within the semiconductor wafer, a gate insulator over the semiconductor wafer between the source and the drain, and a gate over the gate insulator, wherein the source and drain of the PMOS transistor and the NMOS transistor is joined along a line parallel to the first or the second direction.

9. The semiconductor device according to claim 1, wherein the surface comprises a {100} crystal plane.

10. The semiconductor device according to claim 1, wherein the preferred crystalline plane direction comprises <110> or equivalent direction.

11. The method according to claim 1, wherein all devices on the wafer are aglined only at the first angle.

12. A method of manufacturing a semiconductor device, the method comprising:
a mask for a plurality of semiconductor devices, the mask comprising patterns for gates aligned in a first direction;
positioning the semiconductor wafer in a lithography tool, the wafer rotated such that a second direction on the wafer is parallel to the first direction, wherein the second direction is oriented at an angle of between 5 and 40 degrees from a direction parallel or perpendicular to the <110> or <100> crystalline plane direction;
disposing at least one material layer over the semiconductor wafer; and
forming gates by processing and patterning the semiconductor wafer and/or the at least one material layer using the mask, wherein all the gates of all devices on the wafer are aligned parallel to the second direction.

13. The method according to claim 12, wherein positioning the semiconductor wafer comprises adjusting the angle of rotation to a optimum mechanical stress sensitivity of the semiconductor devices.

14. The method according to claim 12, wherein the semiconductor wafer is positioned to an optimum mechanical stress sensitivity of the semiconductor devices.

15. The method according to claim 12, wherein providing the mask comprises providing a mask set for a plurality of complimentary metal oxide semiconductor (CMOS) devices.

16. The method according to claim 15, wherein the CMOS devices comprise a PMOS transistor and an NMOS transistor, further comprising forming a stress-inducing means for inducing a stress in the PMOS transistor, the NMOS transistor, or both.

17. The method according to claim 12, further comprising forming a layer of silicon nitride over at least some of the plurality of devices, the layer having a thickness of about 150 nm or less.

18. The method according to claim 17, wherein the layer of silicon nitride comprises a stress-inducing layer.

19. The method according to claim 12, wherein the second direction is oriented at an angle of between about 5 and about 40 degrees from a direction parallel to the <100> crystalline plane direction.

20. A method of manufacturing a semiconductor device, the method comprising:
positioning a wafer in a lithography tool, the wafer comprising a notch along a first direction, wherein the wafer is positioned in a second direction, the second direction aligned at a first angle to the first direction, the first angle between about 5 degrees to about 40 degrees;
patterning gates aligned along a third direction, the third direction being parallel or perpendicular to the second direction, wherein, after manufacturing the semiconductor device, the wafer does not comprise gates not aligned about parallel to the third direction.

21. The method according to claim 20, wherein the first direction is <110> or <100> crystal direction.

22. The method according to claim 20, wherein positioning the wafer in a lithography tool comprises rotating the wafer relative to the notch.

23. The method according to claim 20, wherein the semiconductor device comprises NMOS and PMOS devices.

24. The method according to claim 20, wherein the third direction is parallel to the second direction.

* * * * *

UNITED STATES PATENT AND TRADEMARK OFFICE
CERTIFICATE OF CORRECTION

| | |
|---|---|
| PATENT NO. | : 7,449,374 B2 |
| APPLICATION NO. | : 11/710382 |
| DATED | : November 11, 2008 |
| INVENTOR(S) | : Hierlemann et al. |

Page 1 of 1

It is certified that error appears in the above-identified patent and that said Letters Patent is hereby corrected as shown below:

On the Title Page, Item (73) Assignees, 2$^{nd}$ entry, delete "Internatioanl" and insert --International--.
In Col. 9, line 63, delete "aglined" and insert --aligned--.
In Col. 10, line 19, delete "a" and insert --an--.

Signed and Sealed this

Twenty-fourth Day of March, 2009

JOHN DOLL
*Acting Director of the United States Patent and Trademark Office*